US009761616B2

(12) United States Patent
Long et al.

(10) Patent No.: US 9,761,616 B2
(45) Date of Patent: Sep. 12, 2017

(54) MANUFACTURING METHOD OF ARRAY SUBSTRATE WITH REDUCED NUMBER OF PATTERNING PROCESSES ARRAY SUBSTRATE AND DISPLAY DEVICE

(71) Applicant: BOE Technology Group Co., Ltd., Beijing (CN)

(72) Inventors: Chunping Long, Beijing (CN); Yinan Liang, Beijing (CN); Lujiang Huangfu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 7 days.

(21) Appl. No.: 14/646,925

(22) PCT Filed: Oct. 1, 2014

(86) PCT No.: PCT/CN2014/088082
§ 371 (c)(1),
(2) Date: May 22, 2015

(87) PCT Pub. No.: WO2016/000342
PCT Pub. Date: Jan. 7, 2016

(65) Prior Publication Data
US 2016/0254298 A1 Sep. 1, 2016

(30) Foreign Application Priority Data

Jun. 30, 2014 (CN) .......................... 2014 1 0308003

(51) Int. Cl.
*H01L 27/12* (2006.01)
*H01L 21/28* (2006.01)
(Continued)

(52) U.S. Cl.
CPC .... *H01L 27/1288* (2013.01); *H01L 21/28008* (2013.01); *H01L 27/12* (2013.01);
(Continued)

(58) Field of Classification Search
CPC ............. H01L 21/28273; H01L 29/517; H01L 21/28123; H01L 21/28008;
(Continued)

(56) References Cited

U.S. PATENT DOCUMENTS 6,365,935 B1 * 4/2002 Zhang ................. H01L 21/3003
257/347
7,303,945 B2 * 12/2007 Seko ................. H01L 21/31116
257/E21.252
(Continued)

FOREIGN PATENT DOCUMENTS

CN   101145561 A   3/2008
CN   101354511 A   1/2009
(Continued)

OTHER PUBLICATIONS

Aug. 18, 2016—(CN)—Second Office Action Appn 201410308003.1 with English Tran.
(Continued)

*Primary Examiner* — Marcos D Pizarro
*Assistant Examiner* — Shannon Yi
(74) *Attorney, Agent, or Firm* — Banner & Witcoff, Ltd.

(57) ABSTRACT

An array substrate, a manufacturing method thereof and a display device are disclosed. Patterns comprising a gate, a gate insulating layer and a polysilicon active layer are formed on a base substrate by single patterning process. A passivation layer is formed on the substrate surface formed with the patterns, and patterns of a first via and a second via are formed on a surface of the passivation layer by single patterning process. Patterns of a source, a drain and a pixel electrode are formed on the substrate surface formed with the patterns by single patterning process. The source is electrically connected with the polysilicon active layer through the first via, and the drain is electrically connected (Continued)

with the polysilicon active layer through the second via. A pattern of pixel defining layer is formed on the substrate surface formed with the patterns by single patterning process.

6 Claims, 9 Drawing Sheets

(51) Int. Cl.
*H01L 29/66* (2006.01)
*H01L 29/786* (2006.01)
*H01L 21/285* (2006.01)
*H01L 27/32* (2006.01)

(52) U.S. Cl.
CPC ........ *H01L 27/127* (2013.01); *H01L 27/1262* (2013.01); *H01L 27/1274* (2013.01); *H01L 29/66765* (2013.01); *H01L 29/78678* (2013.01); *H01L 29/78696* (2013.01); *H01L 21/28158* (2013.01); *H01L 21/28506* (2013.01); *H01L 27/3244* (2013.01); *H01L 2251/5315* (2013.01)

(58) Field of Classification Search
CPC ......... H01L 21/28158; H01L 21/28506; H01L 2251/5315; H01L 27/12; H01L 27/1262; H01L 27/127; H01L 27/1274; H01L 27/1288; H01L 27/3244; H01L 29/66765; H01L 29/78678; H01L 29/78696
See application file for complete search history.

(56) References Cited

U.S. PATENT DOCUMENTS

| 7,790,582 | B2* | 9/2010 | Oh | H01L 29/66757 257/52 |
| 2001/0003477 | A1* | 6/2001 | Aoki | G02F 1/13454 349/152 |
| 2006/0220034 | A1* | 10/2006 | Yin | H01L 29/66757 257/79 |
| 2007/0072348 | A1* | 3/2007 | Chen | H01L 27/1248 438/149 |
| 2007/0075322 | A1* | 4/2007 | Nakamura | H01L 27/12 257/97 |
| 2007/0161160 | A1* | 7/2007 | Chen | H01L 27/1214 438/149 |
| 2008/0111484 | A1 | 5/2008 | Kwon et al. | |
| 2009/0159894 | A1* | 6/2009 | Yasumatsu | H01L 21/3003 257/72 |
| 2014/0001475 | A1* | 1/2014 | Wang | H01L 27/1288 257/59 |
| 2014/0290864 | A1* | 10/2014 | Ahn | B32B 43/006 156/379.8 |
| 2015/0031154 | A1* | 1/2015 | Nakahara | G02F 1/1362 438/30 |

FOREIGN PATENT DOCUMENTS

| CN | 101369587 A | 2/2009 |
| CN | 101404295 A | 4/2009 |
| CN | 102479752 A | 5/2012 |
| CN | 142614645 A | 7/2012 |
| CN | 102955312 A | 3/2013 |
| CN | 143137558 A | 6/2013 |
| CN | 103258743 A | 8/2013 |
| CN | 143235455 A | 8/2013 |
| CN | 103489827 A | 1/2014 |
| CN | 103489918 A | 1/2014 |

OTHER PUBLICATIONS

Mar. 27, 2015—(WO) International Search Report and Written Opinion PCT/CN2014/088082 with Eng Tran.

Apr. 28, 2016—(CN)—First Office Action Appn 201410308003.1 with English Tran.

* cited by examiner

MANUFACTURING METHOD OF ARRAY SUBSTRATE WITH REDUCED NUMBER OF PATTERNING PROCESSES ARRAY SUBSTRATE AND DISPLAY DEVICE

The application is a U.S. National Phase Entry of International Application No. PCT/CN2014/088082 filed on Oct. 1, 2014, designating the United States of America and claiming priority to Chinese Patent Application No. 201410308003.1 filed on Jun. 30, 2014. The present application claims priority to and the benefit of the above-identified applications and the above-identified applications are incorporated by reference herein in their entirety.

TECHNICAL FIELD

Embodiments of the present invention relate to an array substrate and a manufacturing method thereof, and a display device.

BACKGROUND

With the rapid development of display technology, semiconductor element technology, as the core of display devices, has developed drastically. Among the existing display devices, as a kind of current type light emitting devices, organic light emitting diodes (OLEDs) have been applied in high performance display field more and more due to their features such as self-illumination, fast response, wide viewing angle and possibility of being manufactured on flexible substrates. OLEDs may be classified into PMOLEDs (Passive Matrix Driving OLEDs) and AMOLED (Active Matrix Driving OLEDs) according to their driving manners.

In AMOLED architecture, non-crystalline sillcon, polysilicon, oxide semiconductor, or organic thin film transistor may be used for driving. However, in a conventional process of manufacturing the above-mentioned AMOLED array substrate, a number of patterning processes is required, such as 8~9 times of mask exposure processes. Therefore, not only the technological process is complex and cost is high, but also the overmany processing steps would result in continuous accumulation of production errors, making it difficult to guarantee the quality of AMOLED display devices.

SUMMARY

According to a first aspect of the present invention, there is provided a manufacturing method of an array substrate, comprising: forming patterns comprising a gate, a gate insulating layer and a polysilicon active layer on a base substrate by single patterning process; forming a passivation layer on a surface of the substrate formed with the patterns, and forming patterns of a first via and a second via on a surface of the passivation layer by single patterning process; forming patterns of a source, a drain and a pixel electrode on the surface of the substrate formed with the patterns by single patterning process, wherein the source is electrically connected with the polysilicon active layer through the first via and the drain is electrically connected with the polysilicon active layer through the second via; and forming a pattern of a pixel defining layer on a surface of the substrate formed with the patterns by single patterning process.

Another aspect of embodiments of the present invention provides an array substrate comprising:

a base substrate; a gate, a gate insulating layer and a polysilicon active layer formed on the base substrate; a passivation layer formed on a surface of the polysilicon active layer, and a first via and a second via both located on a surface of the passivation layer; a source electrically connected with the polysilicon active layer through the first via; a drain electrically connected with the polysilicon active layer through the second via; and a pixel electrode electrically connected with the drain.

According to yet another aspect of the present invention there is provided a display device comprising any of the array substrates as described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
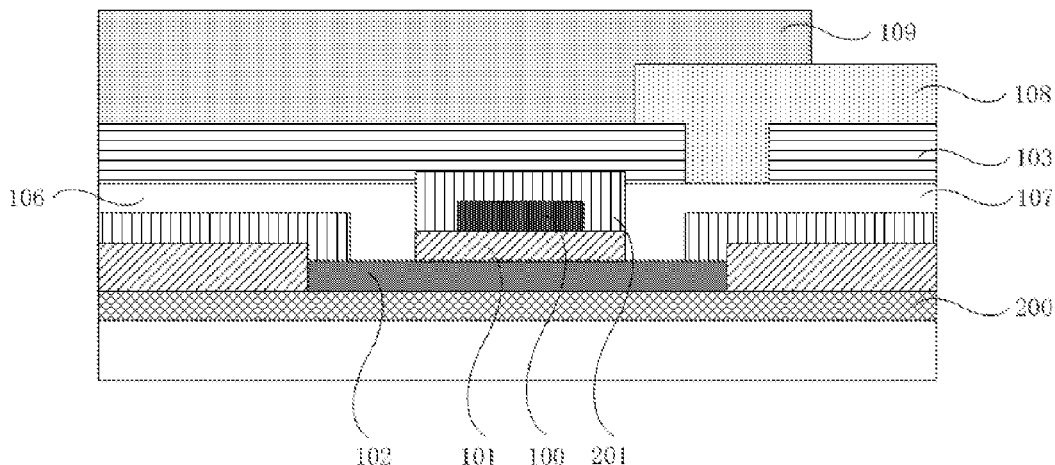
FIG. 1 is a schematic structure diagram of a known array substrate.

As shown in FIG. 1, in an AMOLED array substrate utilizing polysilicon, a polysilicon active layer 102 made of polysilicon is located on the surface of a buffer layer 200; a gate insulating layer 101, a gate 100, an interlayer insulating layer 201 are disposed successively on a surface of the above-mentioned polysilicon active layer 102; a source 106 and a drain 107 are electrically connected with the polysilicon active layer 102 through vias on the surface of the interlayer insulating layer 201; a pixel electrode 108 is electrically connected with the drain 107 through a via on the surface of the passivation layer 103; and a pixel defining layer 109 is disposed on both surfaces of pixel electrode 108 and the passivation layer 103.

However, in the conventional process of manufacturing the above-mentioned AMOLED array substrate, a number of patterning processes is required, such as 8~9 times of mask exposure processes. Not only the technological process is complex and cost is high, but also the overmany processing steps would result in continuous accumulation of production errors, making it difficult to guarantee the quality of AMOLED display devices.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 2:
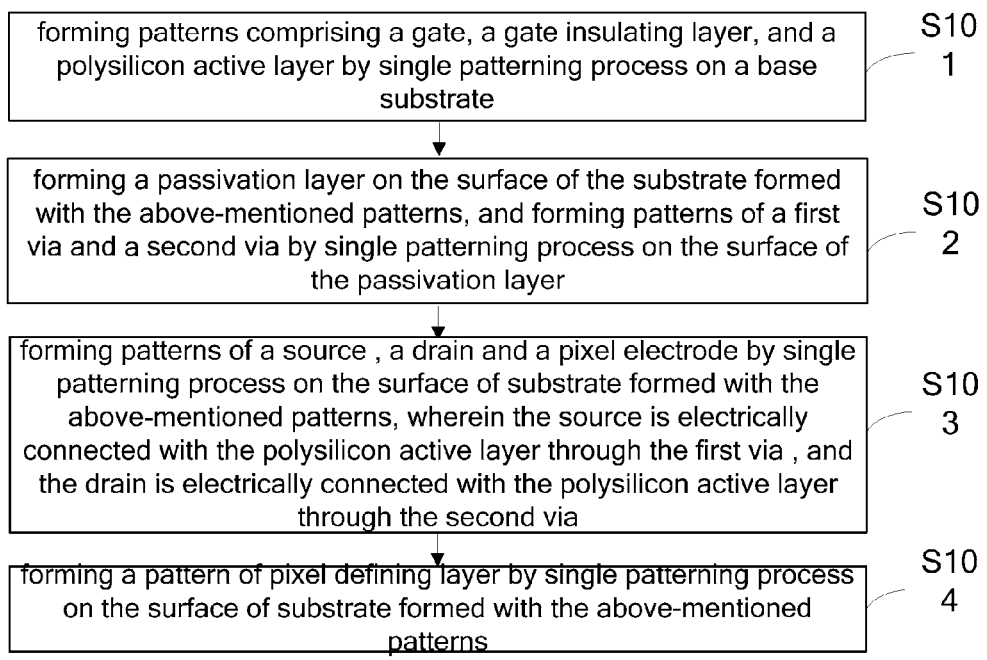
FIG. 2 is a flow chart of a manufacturing method of an array substrate provided in an embodiment of the present invention.
Figure 3A:
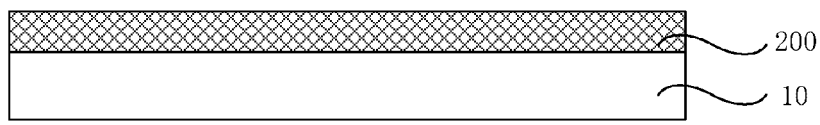
FIGS. 3a-3e are schematic structure diagrams in steps of the manufacturing process of another array substrate provided in an embodiment of the present invention.
Figure 3B:
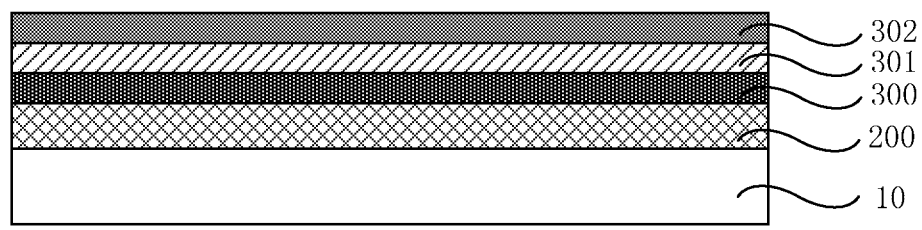
Figure 3C:
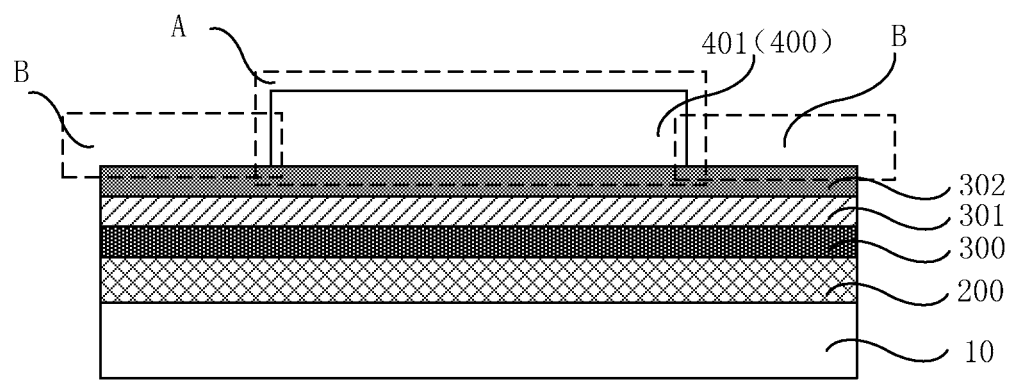
Figure 3D:
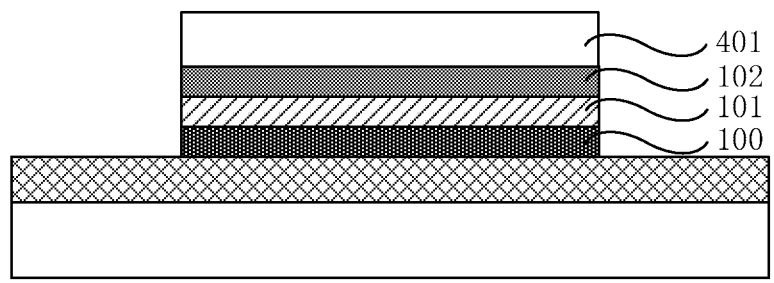
Figure 7A:
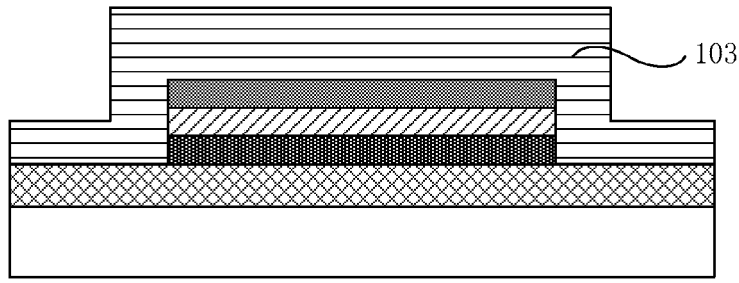
FIGS. 7a-7b are schematic structure diagrams in steps of the manufacturing process of yet another array substrate provided in an embodiment of the present invention.
Figure 7B:
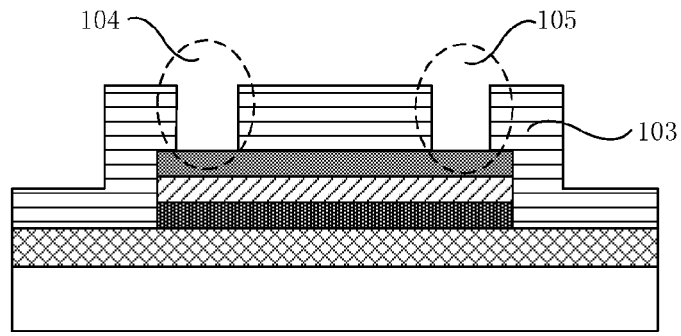
Figure 9A:
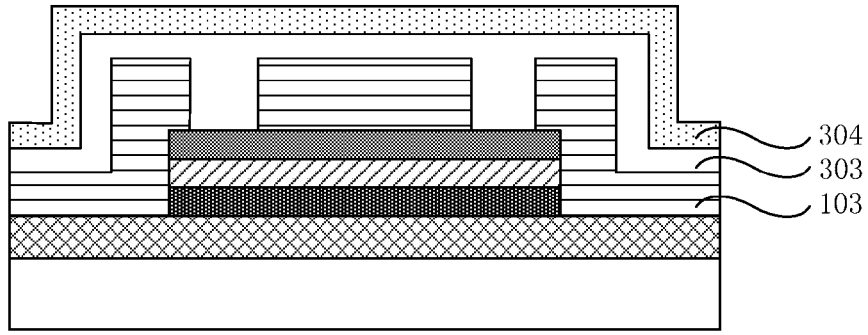
FIGS. 9a-9c are schematic structure diagrams in steps of the manufacturing process of yet another array substrate provided in an embodiment of the present invention.
Figure 9B:
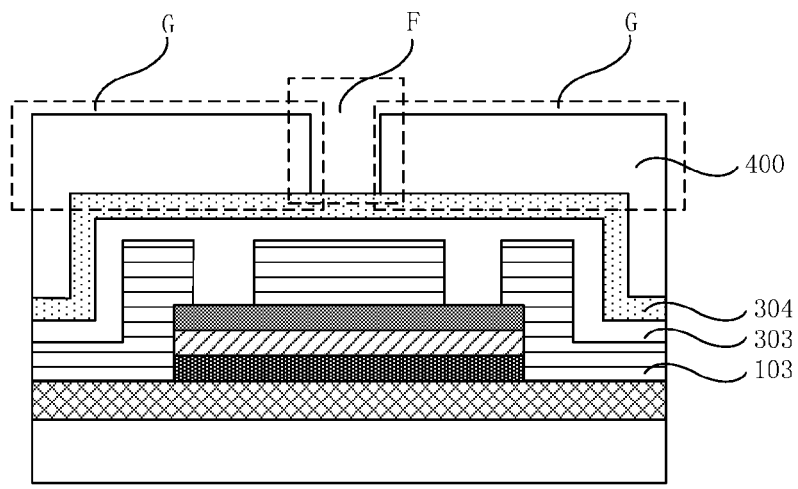
Figure 9C:
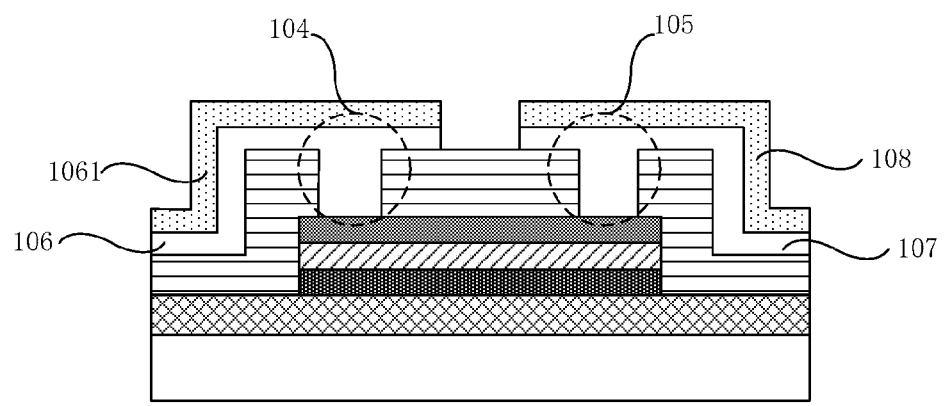
Figure 10:
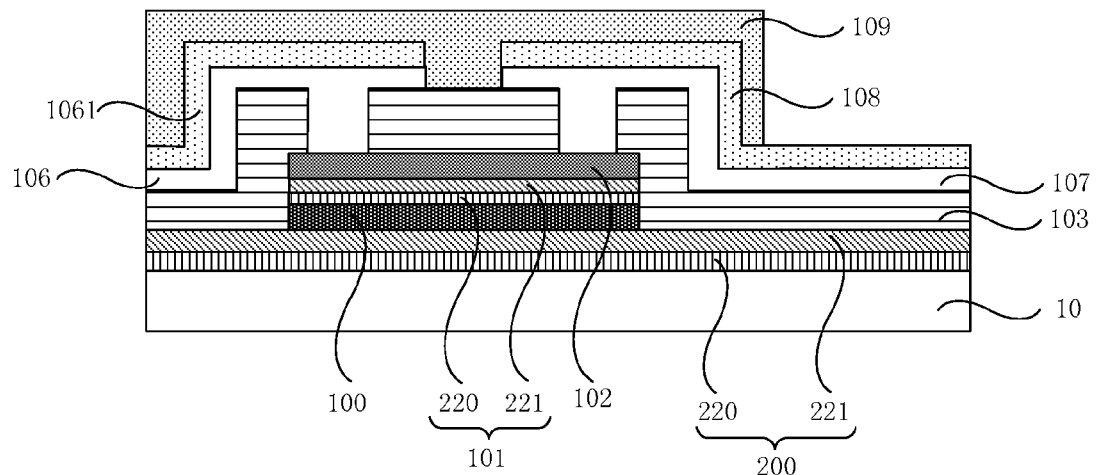
FIG. 10 is a schematic structure diagram of an array substrate provided in an embodiment of the present invention.
Figure 13:
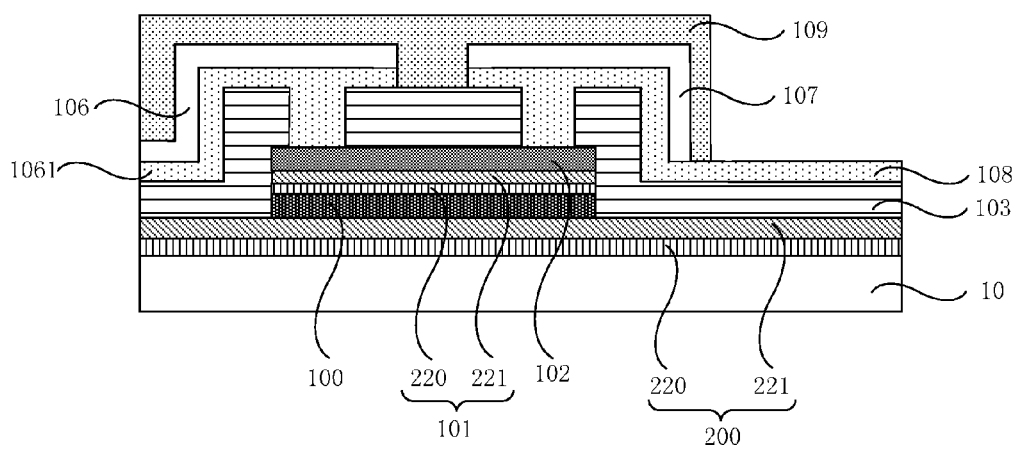
FIG. 13 is a schematic structure diagram of yet another array substrate provided in an embodiment of the present invention.

An embodiment of the present invention provides a manufacturing method of an array substrate, as shown in FIG. 2, comprising:

S101, forming patterns comprising a gate 100, a gate insulating layer 101, and a polysilicon active layer 102 by single patterning process on a base substrate 10 shown in FIG. 3*d*;

S102, as shown in FIG. 7*b*, forming a passivation layer 103 on the surface of the substrate formed with the above-mentioned patterns, and forming patterns of a first via 104 and a second via 105 by single patterning process on the surface of the passivation layer 103;

S103, as shown in FIG. 9*c*, forming patterns of a source 106, a drain 107 and a pixel electrode 108 by single patterning process on the surface of substrate formed with the above-mentioned patterns, wherein the source 106 is electrically connected with the polysilicon active layer 102 through the first via 104, and the drain 107 is electrically connected with the polysilicon active layer 102 through the second via 105; and S104, as shown in FIG. 10 or 13, forming a pattern of pixel defining layer 109 by single patterning process on the surface of substrate formed with the above-mentioned patterns.

It is to be noted that in the present invention, patterning process may comprise photolithographic process, or comprise both photolithographic process and etching step, and may further comprise processes for forming predetermined patterns such as printing and ink jetting. Photolithographic process refers to a process for forming patterns which comprises steps of film formation, exposure, development, and so on by using photoresist, masks and exposure machines. Suitable patterning processes may be selected according to the structure to be formed in the present invention.

Embodiments of the present invention provide an array substrate, a manufacturing method thereof and a display device. In the process of manufacturing the above-mentioned array substrate, it is possible to form a gate, a gate insulating layer and a polysilicon active layer on the base substrate by using a single patterning process; then form patterns of first via and second via on the surface of passivation layer by another single patterning process; and next form the source, drain and pixel electrode by yet another single patterning process, wherein the source and the drain are electrically connected with polysilicon active layer through the first via and the second via, respectively. Finally, the pixel defining layer is formed by a single patterning process. In this way, only four patterning processes are used in the manufacturing process of AMOLED array substrate, thereby effectively reducing the number of patterning processes, simplifying processing steps, decreasing production errors and increasing production efficiency and quality.

Figure 4:
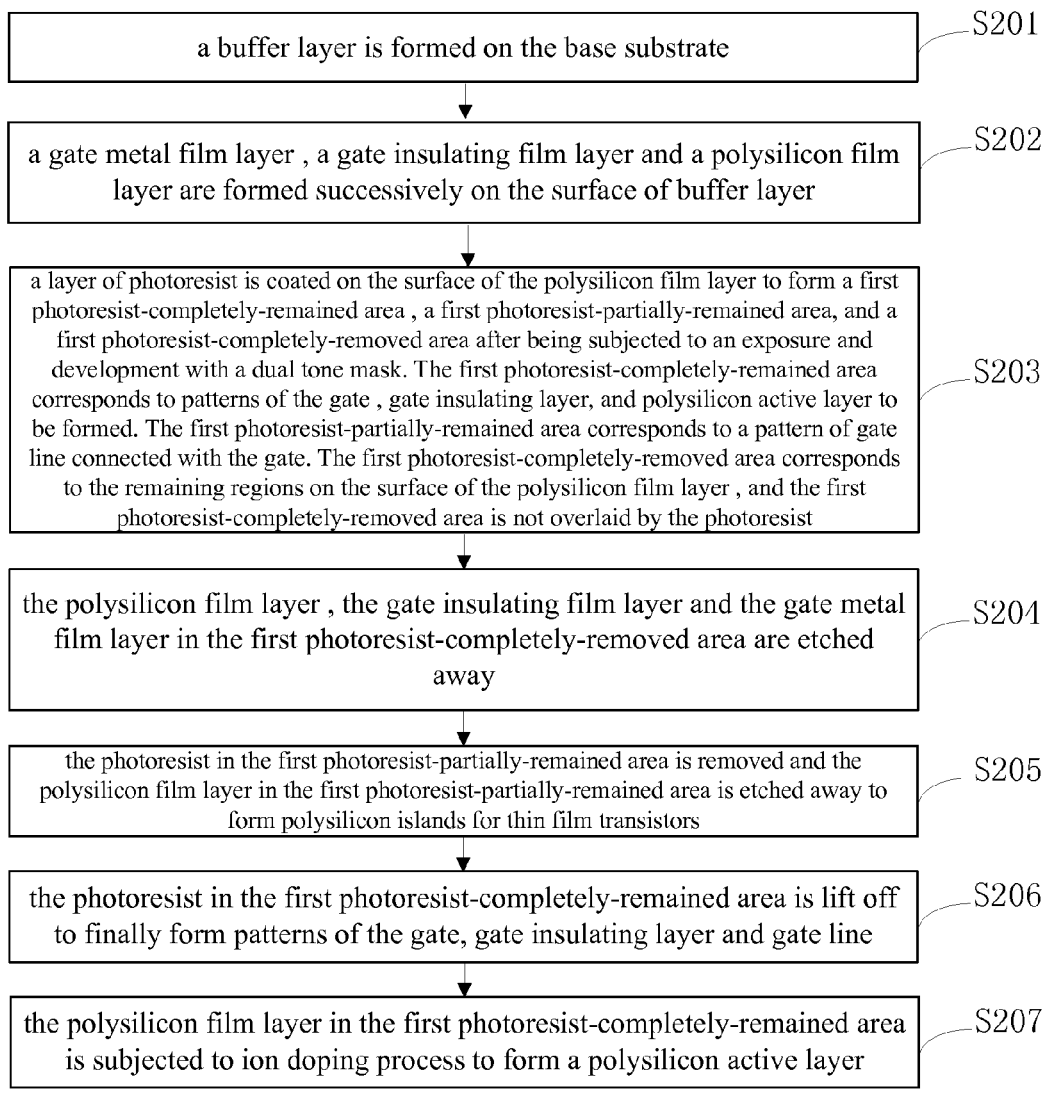
FIG. 4 is a flow chart of a manufacturing method of another array substrate provided in an embodiment of the present invention.

In one example, as shown in FIG. 4, step S101 comprises the following steps:

In S201, as shown in FIG. 3*a*, a buffer layer 200 is formed on the base substrate 10.

For example, as shown in FIG. 10, the buffer layer 200 is located between the base substrate 10 and the gate 100, and comprises a second material layer 221 close to a surface of the gate 100 and a first material layer 220 close to a surface of the base substrate 10.

For example, the first material layer 220 is made of silicon nitride (SiN) with a thickness of 50~100 nm; and the second material layer 221 is made of silicon dioxide (SiO2) with a thickness of 10~400 nm. In this way, the first material layer 220 made of silicon nitride (SiN) has a strong diffusion blocking characteristic, which can suppress influence on polysilicon active layer 102 by metal ions and is waterproof and dust-tight. The second material layer 221 made of silicon dioxide (SiO2) has a good interface with the polysilicon active layer 102 which can prevent the first material layer 220 made of silicon nitride (SiN) from damaging quality of the polysilicon active layer 102 due to the defects in itself.

In S202, as shown in FIG. 3*b*, a gate metal film layer 300, a gate insulating film layer 301 and a polysilicon film layer 302 are formed successively on the surface of buffer layer 200.

For example, a gate metal film layer 300 with a thickness of 20~500 nm is first deposited on the surface of buffer layer 200 by using magnetron sputtering method. The gate metal film layer 300 may be made of at least one metal material of aluminum (Al), copper (Cu), molybdenum (Mo), titanium (Ti), aluminum neodymium alloy (AlNd), or may be a multi-layer metallic composite film, such as molybdenum/ aluminum/molybdenum (Mo/Al/Mo)m or titanium/aluminum/titanium (Ti/Al/Ti); the copper (Cu), molybdenum (Mo) or molybdenum/aluminum/molybdenum (Mo/Al/Mo) are commonly used in production process due to their established and simple manufacturing process.

Then, a gate insulating film layer 301 is deposited on the surface of gate metal film layer 300 with PECVD (Plasma Enhanced Chemical Vapor Deposition). For example, as shown in FIG. 10, the gate insulating layer 101 formed of gate insulating film layer 301 is located between the gate 100 and polysilicon active layer 102, and comprises a first material layer 220 close to on a surface of the gate 100 and a second material layer 221 close to on a surface of the polysilicon active layer 102.

For example, the first material layer 220 is made of silicon nitride (SiN) with a thickness of 20~100 nm; and the second material layer 221 is made of silicon dioxide (SiO2) with a thickness of 30~400 nm. In this way, the first material layer 220 made of silicon nitride (SiN) has a strong diffusion blocking characteristic, which can suppress influence on polysilicon active layer 102 by metal ions. The second material layer 221 made of silicon dioxide (SiO2) has a good interface with the polysilicon active layer 102 which can prevent the first material layer 220 made of silicon nitride (SiN) from damaging quality of the polysilicon active layer 102 due to the defects in itself.

Figure 5:
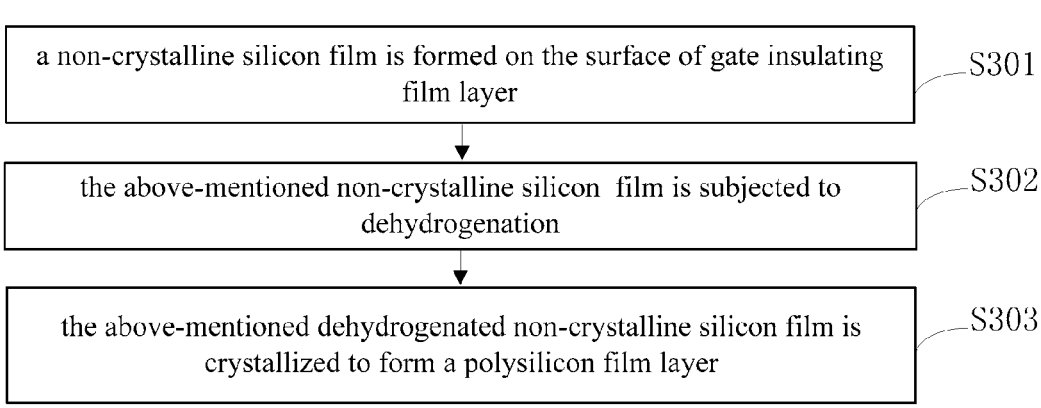
FIG. 5 is a flow chart of a manufacturing method of another array substrate provided in an embodiment of the present invention.

In one example, as shown in FIG. 5, the step of forming a polysilicon film layer 302 on the surface of gate insulating film layer 301 comprises the following steps:

In S301, a non-crystalline silicon (a-Si) film is formed on the surface of gate insulating film layer 301. For example, the non-crystalline silicon (a-Si) film is formed by using chemical vapor deposition (such as PECVD).

For example, the non-crystalline sillicon (a-Si) film is formed on the surface of the second material layer 221 made of silicon dioxide (SiO2).

In S302, the above-mentioned non-crystalline silicon (a-Si) film is subjected to dehydrogenation.

In S303, the above-mentioned dehydrogenated non-crystalline silicon (a-Si) film is crystallized to form a polysilicon film layer 302. For example, Laser annealing crystallization, metal induced crystallization and solid phase crystallization may be applied.

In this way, since the non-crystalline silicon (a-Si) film is dehydrogenated before crystallization, it is possible to prevent, during crystallization process, hydrogen ions from overflowing due to laser radiation etc., which would otherwise cause hydrogen decrepitation phenomenon, resulting in uneven surface of the obtained polysilicon film layer 302 and severely affecting the product quality.

In S203, as shown in FIG. 3c, a layer of photoresist 400 is coated on the surface of the polysilicon film layer 302 to form a first photoresist-completely-remained area A (photoresist 401 has a thickness of 1~3 microns), a first photoresist-partially-remained area (not shown, the photoresist in this area has a thickness of 0.5~1 micron), and a first photoresist-completely-removed area B after being subjected to an exposure and development with a dual tone mask. The first photoresist-completely-remained area A corresponds to patterns of the gate 100, gate insulating layer 101, and polysilicon active layer 102 to be formed. The first photoresist-partially-remained area corresponds to a pattern of gate line (not shown) connected with the gate 100. The above-mentioned first photoresist-completely-removed area B corresponds to the remaining regions on the surface of the polysilicon film layer 302, and the first photoresist-completely-remained area B is not overlaid by the photoresist 400.

It is to be noted that, since the first photoresist-completely-remained area A corresponds to patterns of the gate 100, gate insulating layer 101 and polysilicon active layer 102 to be formed, the patterns of the gate 100, gate insulating layer 101 and polysilicon active layer 102 finally formed with patterning process are consistent. Therefore, regions on the surface of polysilicon film layer 302 that correspond to the regions other than the gate 100 (or gate insulating layer 101 or polysilicon active layer 102) and gate line should be the first photoresist-completely-removed area B.

For example, before coating a layer of photoresist 400 on the surface of polysilicon film layer 302, it is possible to rinse the polysilicon film layer 302 with diluted hydrofluoric acid to reduce surface roughness of the polysilicon film layer 302.

It is to be noted that a dual tone mask may be a semi-transmitting mask that can form two regions of photoresist 400 with different thicknesses (photoresist 401 in the first photoresist-completely-remained area A and photoresist in the first photoresist-partially-remained area) on the surface of polysilicon film layer 302. The dual tone mask may include gray-tone mask or half-tone mask.

In S204, as shown in FIG. 3d, the polysilicon film layer 302, the gate insulating film layer 301 and the gate metal film layer 300 in the first photoresist-completely-removed area B are etched away.

For example, the polysilicon film layer 302 is etched away by plasma or inductive coupling plasma method with mixed gas of carbon tetrafluoride/oxygen (CF4/O2), trifluoro methane/oxygen (CHF3/O2) or sulfur hexafluoride/oxygen (SF6/O2).

Then, the exposed gate insulating film layer 301 is etched off by plasma or inductive coupling plasma method with gas such as carbon tetrafluoride (CF4), carbon tetrafluoride/oxygen (CF4/O2), or trifluoro methane/oxygen (CHF3/O2); since the gate insulating film layer 301 has a second material layer 221 made of silicon dioxide (SiO2), no oxygen (O2) or low flow rate of oxygen (O2) is introduced into the above-mentioned etching gas.

Finally, the gate metal film layer 300 is etched away by wet etching or dry etching, such as inductively coupled plasma etching process with mixed gases such as carbon dichloride/boron trichloride (CCl2/BCl3), or carbon tetrafluoride/oxygen (CF4/O2), so as to form the gate 100 and the gate line electrically connected with the gate 100; since the dry etching process has high precision, it may be used to etch the gate metal film layer 300 while manufacturing display panels with high resolution; and wet etching process may be used to etch the gate metal film layer 300 for display panels with low resolution.

In S205, the photoresist in the first photoresist-partially-remained area is removed and the polysilicon film layer 302 in the first photoresist-partially-remained area is etched away to form polysilicon islands for thin film transistors.

For example, while removing thin photoresist with plasma ashing process, thick photoresist 401 is remained and functions as an etch stop layer. In the ashing process, thin photoresist is removed, while thick photoresist 401 have its thickness reduced. Then the polysilicon film layer 302 overlaying the gate line is etched away with plasma or inductively coupled plasma method.

Figure 3E:
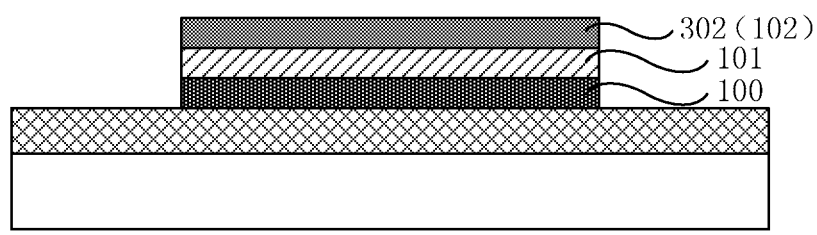

In S206, as shown in FIG. 3e, the photoresist 401 in the first photoresist-completely-remained area A is lift off to finally form patterns of the gate 100, gate insulating layer 101 and gate line. With the above-mentioned step S206, the surface of polysilicon film layer 302 to be used as the polysilicon active layer 102 could be exposed.

In S207, the polysilicon film layer 302 in the first photoresist-completely-remained area A is subjected to ion doping process to form a polysilicon active layer 102. In this way, it is possible to form source/drain contact areas with low impedance to improve electrical conductive performance of thin film transistors.

It is to be noted that in the process of ion doping polysilicon film layer 302 in the first photoresist-completely-remained area A (namely, polysilicon islands of thin film transistors), it is possible to protect regions other than the above-mentioned polysilicon islands by using the mask from being damaged in the ion doping process.

Figure 6:
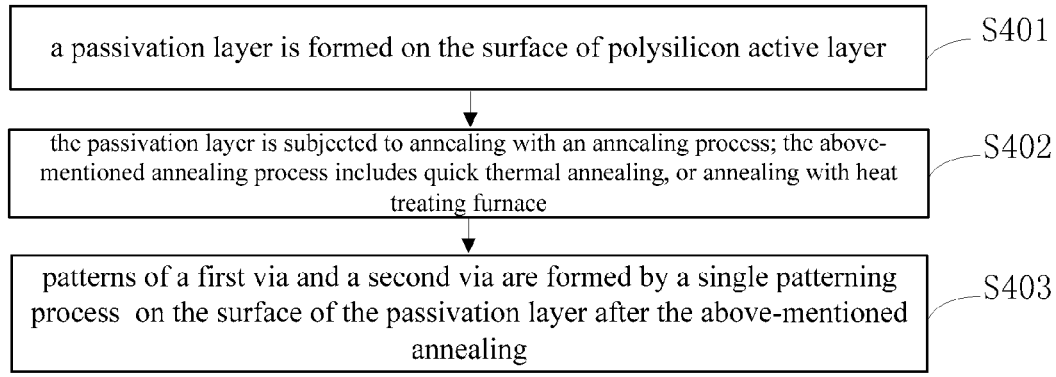
FIG. 6 is a flow chart of a manufacturing method of yet another array substrate provided in an embodiment of the present invention.

In one example, as shown in FIG. 6, the above-mentioned step S102 comprises the following steps:

In S401, as shown in FIG. 7a, a passivation layer 103 is formed on the surface of polysilicon active layer 102. For example, the passivation layer 103 made of silicon nitride (SiN) containing hydrogen element and has a thickness of 20~500 nm.

In S402, the passivation layer 103 is subjected to annealing with an annealing process. The above-mentioned annealing process includes quick thermal annealing, or annealing with heat treating furnace.

In this way, since both passivation layer 103 and gate insulating layer 101 contain silicon nitride (SiN), and passivation layer 103 contains hydrogen element, it is possible to implement hydrogen treatment inside polysilicon active layer 102 and at the interface of polysilicon active layer 102 with silicon nitride (SiN). Dangling bonds in polysilicon active layer 102 may be removed by the above-mentioned hydrogen treatment so as to increase carrier mobility and reduce shifting of threshold voltage.

In S403, as shown in FIG. 7b, patterns of a first via 104 and a second via 105 are formed by a single patterning process (for example, one mask exposure process) on the surface of the passivation layer 103 after the above-mentioned annealing.

Figure 8:
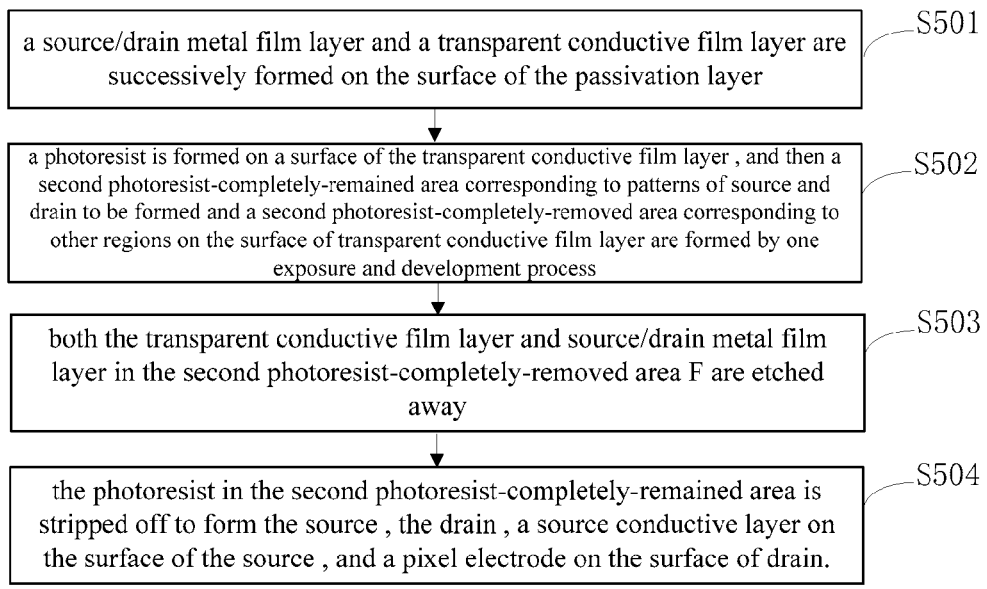
FIG. 8 is a flow chart of a manufacturing method of yet another array substrate provided in an embodiment of the present invention.

In one example, as shown in FIG. 8, the above-mentioned step S103 comprises the following steps:

In S501, as shown in FIG. 9a, a source/drain metal film layer 303 and a transparent conductive film layer 304 are successively formed on the surface of the passivation layer 103.

For example, firstly, a source/drain metal film layer 303 with a thickness of 20~500 nm is deposited on a surface of the passivation layer 103 by magnetron sputtering method. Preferably, the source/drain metal film layer 303 may be made of at least one metal material such as aluminum (Al), copper (Cu), molybdenum (Mo), titanium (Ti), and aluminum neodymium alloy (AlNd), or may be a multi-layer metal film of molybdenum/aluminum/molybdenum (Mo/Al/Mo) or titanium/aluminum/titanium (Ti/Al/Ti). For example, the copper (Cu), molybdenum (Mo) or molybdenum/aluminum/molybdenum (Mo/Al/Mo) are commonly used in production and processing due to their established and simple manufacturing process.

Then, a transparent conductive film layer 304 is deposited on a surface of the source/drain metal film layer 303 by magnetron sputtering method, the layer 304 may be a composite film, such as indium tin oxide/silver/indium tin oxide (ITO/Ag/ITO), or indium zinc oxide/silver (IZO/Ag). For example, ITO film has a thickness of 10~50 nm, and Ag metal film has a thickness of 20~100 nm.

In S502, as shown in FIG. 9b, a photoresist 400 is formed on a surface of the transparent conductive film layer 304, and then a second photoresist-completely-remained area G corresponding to patterns of source 106 and drain 107 to be formed and a second photoresist-completely-removed area F corresponding to other regions on the surface of transparent conductive film layer 304 are formed by one exposure and development process.

For example, there is a gap between the source and the drain. In order to form the gap between the source and the drain, the above-mentioned second photoresist-completely-removed area F comprises a gap area corresponding to the gap between the source 106 and the drain 107 to be formed on the surface of transparent conductive film layer 304.

In S503, as shown in FIG. 9c, both the transparent conductive film layer 304 and source/drain metal film layer 303 in the second photoresist-completely-removed area F are etched away.

In S504, the photoresist in the second photoresist-completely-remained area G is stripped off to form the source 106, the drain 107, a source conductive layer 1061 on the surface of the source 106, and a pixel electrode 108 on the surface of drain 107. It is to be noted that the above-mentioned source conductive layer 1061 may be removed.

In this way, a pixel defining layer 109 is formed by step S104 on the substrate surface formed with the above-mentioned structures and the array substrate as shown in FIG. 10 is completed. The array substrate may be used to form a low temperature polysilicon display panel of top-emitting AMOLED. Light of the display panel may be emitted upward (emitted apart from the surface of base substrate 10). Since the source 106 and the drain 107 formed of the source/drain metal film layer 303 can reflect emitted light, it is possible to increase the aperture ratio of the display panel. Therefore, top-emitting AMOLED display panels may be applied in high resolution display devices.

Figure 11:
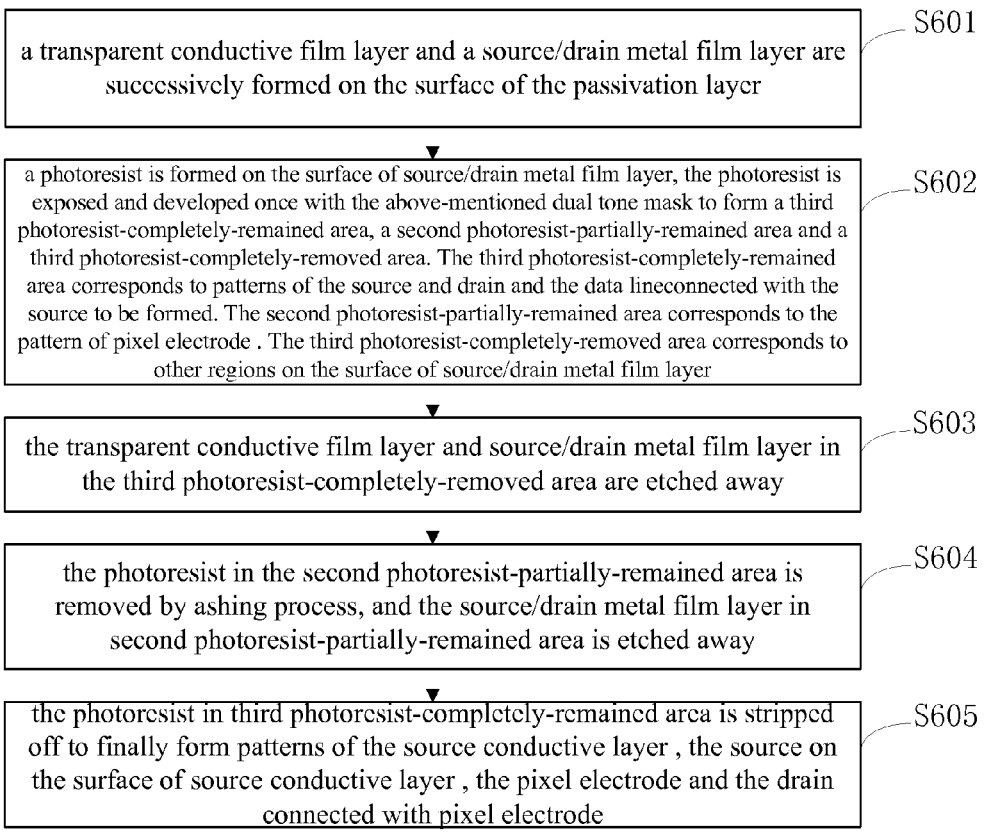
FIG. 11 is a flow chart of a manufacturing method of yet another array substrate provided in an embodiment of the present invention.

In one example, as shown in FIG. 11, the above-mentioned step S103 comprises the following steps.

Figure 12A:
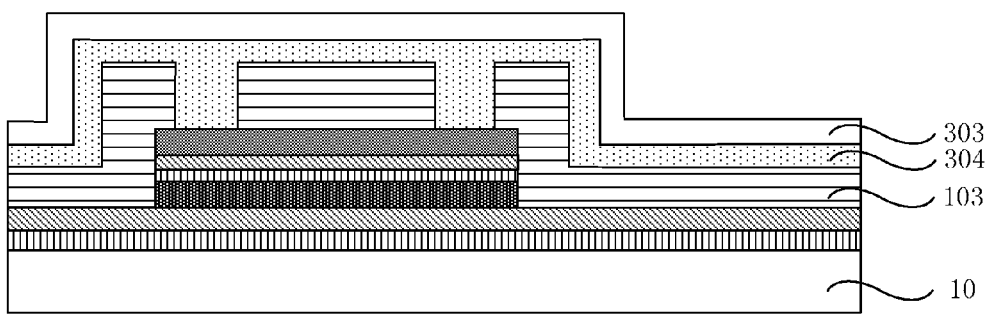
FIGS. 12a-12d are schematic structure diagrams in steps of the manufacturing process of yet another array substrate provided in an embodiment of the present invention.

In S601, as shown in FIG. 12a, a transparent conductive film layer 304 and a source/drain metal film layer 303 are successively formed on the surface of the passivation layer 103.

Firstly, a transparent conductive film layer 304 is deposited on a surface of the passivation layer 103 by magnetron sputtering method and the layer 304 may be a composite film such as indium tin oxide/silver/indium tin oxide (ITO/Ag/ITO), or indium zinc oxide/silver (IZO/Ag), and has a thickness of 20~100 nm.

Then, a source/drain metal film layer 303 with a thickness of 20~500 nm may be deposited on a surface of the transparent conductive film layer 304 by magnetron sputtering method.

Figure 12B:
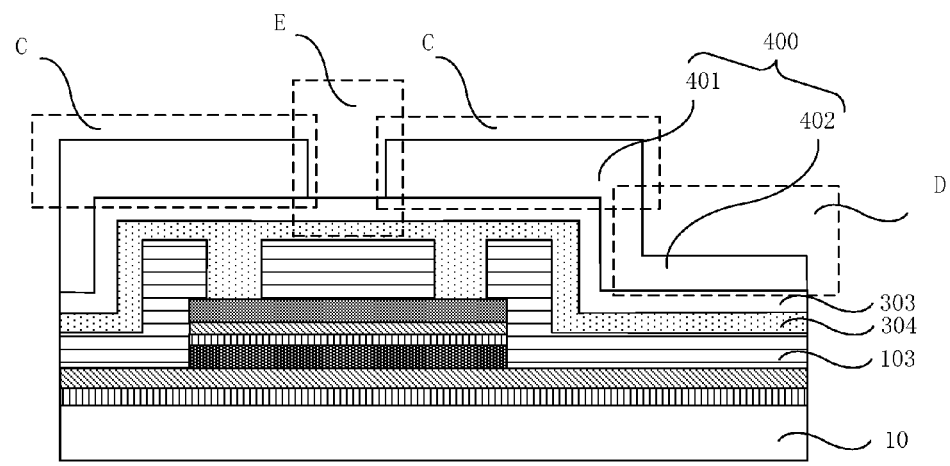

In S602, as shown in FIG. 12b, a photoresist 400 is formed on the surface of source/drain metal film layer 303. The photoresist 400 is exposed and developed once with the above-mentioned dual tone mask to form a third photoresist-completely-remained area C (in which the thickness of photoresist 401 is 1~3 microns), a second photoresist-partially-remained area D (in which the thickness of photoresist 401 is 0.5~1.5 microns) and a third photoresist-completely-removed area E. The third photoresist-completely-remained area C corresponds to patterns of the source 106 and drain 107 and the data line (not shown) connected with the source 106 to be formed. The second photoresist-partially-remained area D corresponds to the pattern of pixel electrode 108. The third photoresist-completely-removed area E corresponds to other regions on the surface of source/drain metal film layer 303.

For example, there is a gap between the source and the drain. In order to form the gap between the source and the drain, the above-mentioned third photoresist-completely-removed area E comprises a gap area corresponding to the gap between the source 106 and the drain 107 to be formed on the surface of transparent conductive film layer 304.

Figure 12C:
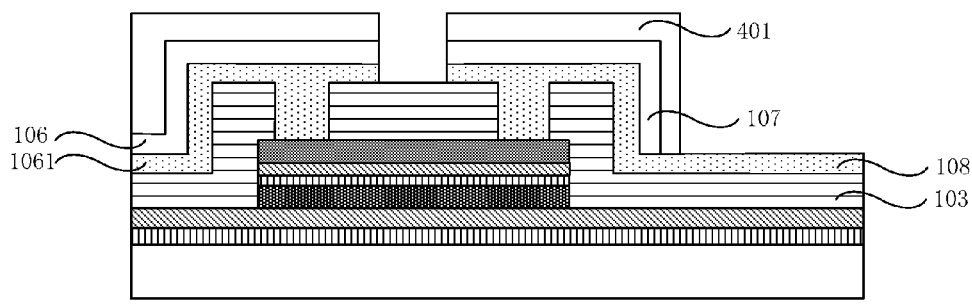

In S603, as shown in FIG. 12c, the transparent conductive film layer 304 and source/drain metal film layer 303 in the third photoresist-completely-removed area E are etched away.

In S604, as shown in FIG. 12c, the photoresist 402 in the second photoresist-partially-remained area D is removed by ashing process, and the source/drain metal film layer 303 in second photoresist-partially-remained area D is etched away. For example, in the ashing process, the thickness of photoresist 401 in third photoresist-completely-remained area C is reduced.

Figure 12D:
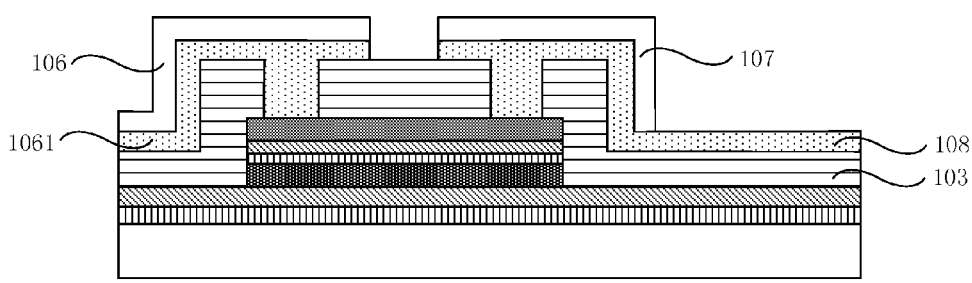

In S605, as shown in FIG. 12d, the photoresist 401 in third photoresist-completely-remained area C is stripped off to finally form patterns of the source conductive layer 1061, the source 106 on the surface of source conductive layer 1061, the pixel electrode 108 and the drain 107 connected with pixel electrode 108.

In this way, a pixel defining layer 109 is formed by step S104 on the substrate surface formed with the above-mentioned structures and the array substrate as shown in FIG. 13 is completed. The array substrate may be used to form a low temperature polysilicon display panel of bottom-emitting AMOLED. Light of the display panel may be emitted downward (emitted towards the surface of base substrate 10). In this way, since thin film transistors would block partial light, the display panel will have small aperture ratio. Therefore, bottom-emitting AMOLED display panels may be applied in low resolution display devices.

An embodiment of the present invention provides an array substrate as shown in FIG. 10 or 13, comprising:
   a base substrate 10;
   a gate 100, a gate insulating layer 101 and a polysilicon active layer 102 formed on the base substrate 10;
   a passivation layer 103 formed on the surface of polysilicon active layer 102 and a first via 104 and a second via 105 formed on the surface of passivation layer 103;
   a source 106 electrically connected with the polysilicon active layer 102 through the first via 104;
   a drain 107 electrically connected with the polysilicon active layer 102 through the second via 105; and
   a pixel electrode 108 electrically connected with the drain 107.

An embodiment of the present invention provides an array substrate comprising a base substrate, a gate, a gate insulating layer and a polysilicon active layer formed on the base substrate, a passivation layer formed on a surface of polysilicon active layer, a first via and a second via formed on the surface of passivation layer, a source electrically connected with the polysilicon active layer through the first via, a drain electrically connected with the polysilicon active layer through the second via and a pixel electrodes electrically connected with the drain. In this way, in the process of manufacturing the above-mentioned AMOLED array substrate, it uses only four patterning processes, thereby effectively reducing the number of patterning processes, simplifying processing steps, reducing production errors and increasing production efficiency and quality.

In one example, the gate 100, the gate insulating layer 101 and the polysilicon active layer 102 are located successively on the surface of base substrate 10; and patterns of the gate 100, the gate insulating layer 101 and the polysilicon active layer 102 are consistent with one another. In this way, the gate 100, the gate insulating layer 101 and the polysilicon active layer 102 can be manufactured on the surface of base substrate 10 by single patterning process, which can simplify manufacturing process and increase productivity and product quality.

An embodiment of the present invention provides a display device comprising any of the above-mentioned array substrates, which has the same beneficial effect as the array substrate provided in the above-mentioned embodiments of the present invention. Since the specific structure of array substrate has been described in detail in the above-mentioned embodiments, it will not be described any more herein.

In embodiments of the present invention, the display device may be any product or component with display function such as a liquid crystal display, a liquid crystal TV set, a digital picture frame, a cell phone or a tablet computer.

An embodiment of the present invention provides a display device comprising an array substrate. The array substrate comprises a base substrate, a gate, a gate insulating layer and a polysilicon active layer formed on the base substrate, a passivation layer formed on a surface of the polysilicon active layer, and a first via and a second via formed on the surface of the passivation layer, wherein a source is electrically connected with the polysilicon active layer through the first via and a drain is electrically connected with the polysilicon active layer through the second via. In this way, in the process of manufacturing the above-mentioned AMOLED array substrate, it uses only four patterning processes, thereby effectively reducing the number of patterning processes, simplifying processing steps, reducing production errors and increasing production efficiency and quality.

What is described above is related to the illustrative embodiments of the disclosure only and not limitative to the scope of the disclosure; the scopes of the disclosure are defined by the accompanying claims.

The present application is based on and claims the priority of China Patent application No. 201410308003.1 filed on Jun. 30, 2014, the disclosure of which is incorporated herein in its entirety by reference.

The invention claimed is:

1. A method of manufacturing an array substrate, comprising:
   forming patterns comprising a gate, a gate insulating layer and a polysilicon active layer on a base substrate by one patterning process;
   forming a passivation layer on a surface of the substrate formed with the patterns, and forming patterns of a first via and a second via on a surface of the passivation layer by one patterning process;
   forming patterns of a source, a drain and a pixel electrode on the surface of the substrate formed with the patterns by one patterning process, wherein the source is electrically connected with the polysilicon active layer through the first via and the drain is electrically connected with the polysilicon active layer through the second via; and
   forming a pattern of a pixel defining layer on a surface of the substrate formed with the patterns by one patterning process,
   wherein the step of forming patterns of a source, a drain and a pixel electrode on the surface of the substrate formed with the patterns comprises:

forming a source/drain metal film layer and a transparent conductive film layer successively on the surface of the passivation layer;

forming a photoresist on a surface of the transparent conductive film layer, and forming a second photoresist-completely-remained area corresponding to patterns of the source and the drain to be formed and a second photoresist-completely-removed area corresponding to remaining regions on the surface of the transparent conductive film layer by one exposure and development process on the surface of the transparent conductive film layer;

etching the transparent conductive film layer and the source/drain metal film layer in the second photoresist-completely-removed area; and stripping the photoresist in the second photoresist-completely-remained area to finally form the source, the drain, a source conductive layer located on a surface of the source, and the pixel electrode located on a surface of the drain, wherein the source/drain metal film layer is not patterned before the transparent conductive film layer is formed, wherein the gate insulating layer is located between the gate and the polysilicon active layer and comprises a second material layer close to the gate and a first material layer close to the polysilicon active layer, wherein the first material layer is made of silicon nitride and the second material layer is made of silicon dioxide, wherein forming the passivation layer on the surface of the substrate formed with the patterns, and forming the patterns of the first via and the second via on the surface of the passivation layer comprises:

forming the passivation layer on a surface of the polysilicon active layer, wherein the passivation layer is made of a silicon nitride film containing hydrogen element;

annealing the passivation layer with an annealing process; and forming patterns of the first via and the second via on a surface of the passivation layer subjected to the annealing process by one patterning process.

2. The method of claim 1, wherein the step of forming patterns comprising a gate, a gate insulating layer and a polysilicon active layer on a base substrate by one patterning process comprises:

overlaying a buffer layer on the base substrate;

forming a gate metal film layer, a gate insulating film layer and a polysilicon film layer successively on the surface of the buffer layer;

coating a layer of photoresist on a surface of the polysilicon film layer, and forming a first photoresist-completely-remained area, a first photoresist-partially-remained area and a first photoresist-completely-removed area after one exposure and development process, the first photoresist-completely-remained area corresponding to patterns of the gate, the gate insulating layer and the polysilicon active layer to be formed, the first photoresist-partially-remained area corresponding to patterns of a gate line connected with the gate, and the first photoresist-completely-removed area corresponding to remaining regions on the surface of the polysilicon film layer;

etching the polysilicon film layer, the gate insulating film layer and the gate metal film layer in the first photoresist-completely-removed area;

removing the photoresist in the first photoresist-partially-remained area and etching the polysilicon film layer in the first photoresist-partially-remained area;

stripping the photoresist in the first photoresist-completely-remained area to finally form patterns of the gate, the gate insulating layer and the gate line; and ion doping the polysilicon film layer in the first photoresist-completely-remained area to form a pattern of the polysilicon active layer.

3. The method of claim 2, wherein
the buffer layer is located between the gate and the base substrate and comprises the first material layer close to the gate and the second material layer close to the base substrate.

4. The method of claim 2, wherein the step of forming the polysilicon film layer on a surface of the gate insulating film layer comprises:

forming a non-crystalline silicon film on a surface of the gate insulating film layer;

dehydrogenating the non-crystalline silicon film; and crystallizing the dehydrogenated non-crystalline silicon film to form the polysilicon film layer.

5. The method of claim 2, wherein the gate metal film layer and the source/drain metal film layer are both made of one or more of aluminum, molybdenum, copper and titanium.

6. The method of claim 2, wherein before the step of coating a layer of photoresist on a surface of the polysilicon film layer, the method further comprises:

rinsing the surface of the polysilicon film layer with diluted hydrofluoric acid.

* * * * *